US008967567B2

(12) United States Patent  
Chen et al.

(10) Patent No.: US 8,967,567 B2  
(45) Date of Patent: Mar. 3, 2015

(54) BRACKET PIN ASSEMBLY

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Chien-Li Huang, Kaohsiung (TW); Yao-Tsung Chen, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 174 days.

(21) Appl. No.: 13/661,563

(22) Filed: Oct. 26, 2012

(65) Prior Publication Data

US 2014/0117180 A1    May 1, 2014

(51) Int. Cl.  
*A47G 29/02*    (2006.01)

(52) U.S. Cl.  
USPC .......... 248/244; 211/26; 211/192; 312/334.4; 312/334.5

(58) Field of Classification Search  
USPC .......... 248/244, 201, 220.21; 312/312, 334.5, 312/319.1, 334.1, 334.4; 211/26, 192  
See application file for complete search history.

(56) References Cited

U.S. PATENT DOCUMENTS

| 7,281,694 | B2  | 10/2007 | Allen et al. |
| 7,694,926 | B2  | 4/2010  | Allen et al. |
| 7,699,279 | B2  | 4/2010  | Chen et al. |
| 7,731,142 | B2* | 6/2010  | Chen et al. ................... 248/244 |
| 7,857,145 | B2  | 12/2010 | Mushan et al. |
| 7,878,468 | B2  | 2/2011  | Chen et al. |
| 7,930,812 | B2  | 4/2011  | Curnalia et al. |
| 8,104,626 | B2  | 1/2012  | Huang et al. |

* cited by examiner

*Primary Examiner* — Amy J Sterling  
(74) *Attorney, Agent, or Firm* — Rosenberg, Klein & Lee (57) ABSTRACT

A bracket pin assembly includes a support plate having an end plate which has at least one opening. The pin includes a base, a support member, a first installation member, a second installation member, and a resilient member. The base has a chamber and the support member is connected to the base. The first and second installation members respectively have a first engaging portion and a second engaging portion. The support member has an engaging section. The resilient member is located in the chamber of the base to bias the first and second installation members. When the installation members of the pin extend through the first installation holes of the first post, the first and second engaging portions are engaged with the engaging section of the support members to secure the first and second installation members relative to the support members.

12 Claims, 11 Drawing Sheets

BRACKET PIN ASSEMBLY

FIELD OF THE INVENTION

The present invention relates to a bracket pin assembly, and more particularly, to a pin assembly mounted to racks with different shapes of holes.

BACKGROUND OF THE INVENTION

The conventional support bracket pin assemblies are disclosed in U.S. Pat. No. 7,857,145 to Mushan, U.S. Pat. No. 7,878,468 to Chen et al and U.S. Pat. No. 8,104,626 to Huang.

The conventional support bracket pin assembly is designed to be resiliently retractable so that the pin can be connected to square holes or circular holes of racks. However, aside from U.S. Pat. No. 7,878,468 to Chen et al discloses a positioning device, the rest of the above disclosed prior arts do not have a proper positioning device so that the pin may shift or slide due to vibration.

In addition, the conventional pin of bracket cannot be connected to three different shapes of holes of racks.

The present invention intends to provide a bracket pin assembly which is able to be firmly connected to a rack, and the pin can prevent from being retracting inward.

SUMMARY OF THE INVENTION

The present invention relates to a bracket pin assembly and comprises a support plate having an end plate which has at least one opening. A pin is connected to the end plate of the support plate and comprises a base, a support member, a first installation member, a second installation member and at least one resilient member. The base has a chamber. The support member is connected to the base and has a support section and an engaging section. The support section extends through the chamber of the base and the at least one opening of the end plate. The engaging section located in a part of the support section. The first installation member is movably connected to the chamber of the base and comprises a first support portion, a first contact portion, a first recess and a first engaging portion. The first contact portion extends from the first support portion and contacts the wall around the at least one opening of the end plate. The first support portion extends through the chamber and the at least one opening of the end plate. The first recess is located beside the first support portion. The first engaging portion is located in the first recess and adapted to be contact with the engaging section of the support member. The second installation member is movably connected to the chamber of the base and comprises a second support portion, a second contact portion, a second recess and a second engaging portion. The second contact portion extends from the second support portion and contacts the wall around the at least one opening of the end plate. The second support portion extends through the chamber and the at least one opening of the end plate. The second recess is located beside the second support portion. The second engaging portion is located in the second recess and adapted to be contact with the engaging section of the support member. The at least one resilient member is located in the chamber of the base and provides elastic force to the first and second installation members.

Preferably, the first and second installation members form a rectangular combination, and the support member is a cylindrical member. The first recess of the first installation member and the second recess of the second installation member are respectively configured as semi-circular recesses corresponding to the cylindrical member of the support member.

Preferably, the engaging section of the support member is an annular recess around the part of the support section. The first engaging portion of the first installation member extends from the first recess and the second engaging portion of the second installation member extends from the second recess.

Preferably, the at least one opening of the end plate has first and second windows having different sizes from each other. The first and second windows are simply and respectively passed through by the first and second installation members. At least two resilient members respectively provide elastic forces to the first and second installation members.

Preferably, the end plate comprises two openings which are separately aligned separately aligned in vertical direction. The bracket has two pins, corresponding to the two separated openings, assembled with the two openings in the upper and lower portions of the end plate of the support plate.

Preferably, the bracket has two pins, corresponding to the two separated openings, assembled with the openings in the upper and lower portions of the end plate of the support plate.

Alternatively, the present invention provides a bracket pin assembly which comprises a support plate having an end plate which has at least one opening. The at least one opening has first and second windows having different sizes from each other. A pin is connected to the end plate of the support plate and comprises a base, a support member, a first installation member, a second installation member and at least two resilient members. The base has a chamber. The support member is connected to the base and extends through the chamber of the base and the at least one opening of the end plate. The first installation member is movably connected to the chamber of the base and comprises a first support portion and a first contact portion. The first contact portion extends from the first support portion and contacts the wall around the at least one opening of the end plate. The first support portion extends through the chamber and the first window of the at least one opening of the end plate. The second installation member is movably connected to the chamber of the base and comprises a second support portion and a second contact portion. The second contact portion extends from the second support portion and contacts the wall around the at least one opening of the end plate. The second support portion extends through the chamber and the second window of the at least one opening of the end plate. The at least two resilient members are located in the chamber of the base and provide elastic force to the first and second installation members respectively.

Preferably, the first installation member has a first recess, the second installation member has a second recess, the first and second installation members form a rectangular combination and the support member is a cylindrical member. The first recess of the first installation member and the second recess of the second installation member are respectively configured as semi-circular recesses corresponding to the cylindrical member of the support member.

Preferably, the end plate comprises two openings which are separately aligned in vertical direction. The bracket has two pins are connected to upper and lower portions of the end plate and located corresponding to the two openings.

Preferably, the bracket has two pins, corresponding to the two separated openings, assembled with the two openings in the upper and lower portions of the end plate of the support plate.

Alternatively, the present invention provides a bracket pin assembly installed to a first rack/post, a second rack/post or a third rack/post. The first post has multiple first installation holes which are separately aligned in vertical direction. The second post has multiple second installation holes which are separately aligned in vertical direction. The third post has multiple third installation holes which are separately aligned in vertical direction. The bracket pin assembly comprises a support plate having an end plate which has two openings separately aligned in vertical direction. Each of the openings has first and second windows having different sizes from each other. The bracket has two pins, corresponding to the openings of the end plate, installed in the upper and lower portions of the end plate. Each pin comprises a base, a support member, a first installation member, a second installation member, a first resilient member and a second resilient member. The base has a chamber. The support member is connected to the base and has a support section and an engaging section. The support section extends through the chamber of the base and the opening of the end plate. The engaging section located in a part of the support section. The first installation member is movably connected to the chamber of the base and comprises a first support portion, a first contact portion, a first recess and a first engaging portion. The first contact portion extends from the first support portion and contacts the wall around the opening of the end plate. The first support portion extends through the chamber and the first window of the opening of the end plate. The first recess is located beside the first support portion. The first engaging portion is located in the first recess and can be engaged with the engaging section of the support member. The second installation member is movably connected to the chamber of the base and comprises a second support portion, a second contact portion, a second recess and a second engaging portion. The second contact portion extends from the second support portion. The second contact portion extends from the second support portion and contacts the wall around the opening of the end plate. The second support portion extends through the chamber and the second window of the opening of the end plate. The second recess is located beside the second support portion. The second engaging portion is located in the second recess and can be engaged with the engaging section of the support member. The first resilient member is located in the chamber of the base and biases the first installation members. The second resilient member is located in the chamber of the base and biases the second installation members. When the bracket assembly is installed to the first post, the support members, the first installation members and the second installation members of the two pins extend through the first installation holes of the first post. When the bracket assembly is installed to the second post, the support members of the two pins extend through the second installation holes of the second post. The first and second installation members contact the second post. When the bracket assembly is installed to the third post, the support members and the first installation members of the two pins extend through the third installation holes of the third post. The second installation members of the pins contact the third post.

Preferably, the first and second installation members form a rectangular combination and the support member is a cylindrical member. The first recess of the first installation member and the second recess of the second installation member are respectively configured as semi-circular recesses corresponding to the cylindrical member of the support member.

Preferably, the engaging section of the support member is an annular around the part of the support section. The first engaging portion of the first installation member extends from the first recess and the second engaging portion of the second installation member extends from the second recess.

Preferably, the second installation member of the upper pin of the end plate is located below the support member. The second installation member of the lower pin of the end plate is located above the support member. The second installation member has a larger width than that of the first installation member and hence cannot extend through the third installation holes of the third post.

Preferably, the first installation holes of the first post are square holes with the size of 9.5 mm×9.5 mm. Hence, the support members, the first and second installation members of the two pins extend through the first installation hole. The second installation holes of the second post are circular holes with the diameter of 7.0 mm. Hence, the support members of the two pins extend through the second installation holes. The third installation holes of the third post are square holes with the size of 9.0 mm×9.0 mm. Hence, the support members and the first installation members of the two pins extend through the third installation holes.

One aspect of the present invention is to provide a bracket pin assembly that prevents the pins from retracting inward and can be firmly connected to a rack or post.

Another aspect of the present invention is to provide a bracket pin assembly that can be installed to racks or posts with different sizes of holes.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
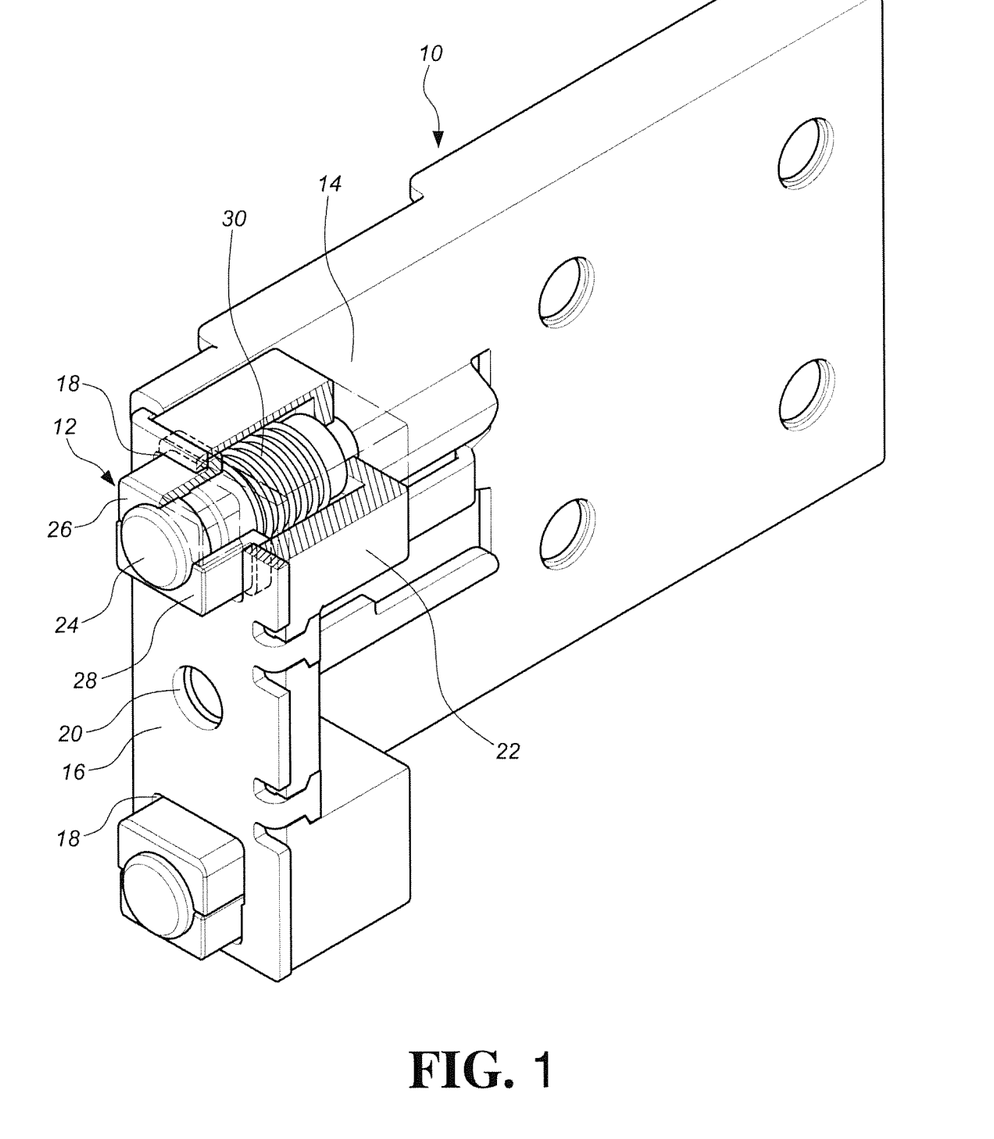
FIG. 1 is a perspective view to show a first embodiment of the bracket pin assembly of the present invention.

Referring to FIG. 1, the bracket pin assembly of the present invention comprises a support plate 10 and at least one pin 12.

The support plate 10 comprises a side plate 14 and an end plate 16 which is substantially perpendicular to the side plate 14. Preferably, the end plate 16 extends perpendicularly from the side plate 14. The end plate 16 has at least one opening 18 and a connection hole 20. In a preferred embodiment, the end plate 16 comprises two openings 18 which are separately aligned in vertical direction. The connection hole 20 is located between the two openings 18.

The pin 12 is connected to the end plate 16 of the support plate 10 and comprises a base 22, a support member 24, a first installation member 26, a second installation member 28 and at least one resilient member 30.

Figure 2:
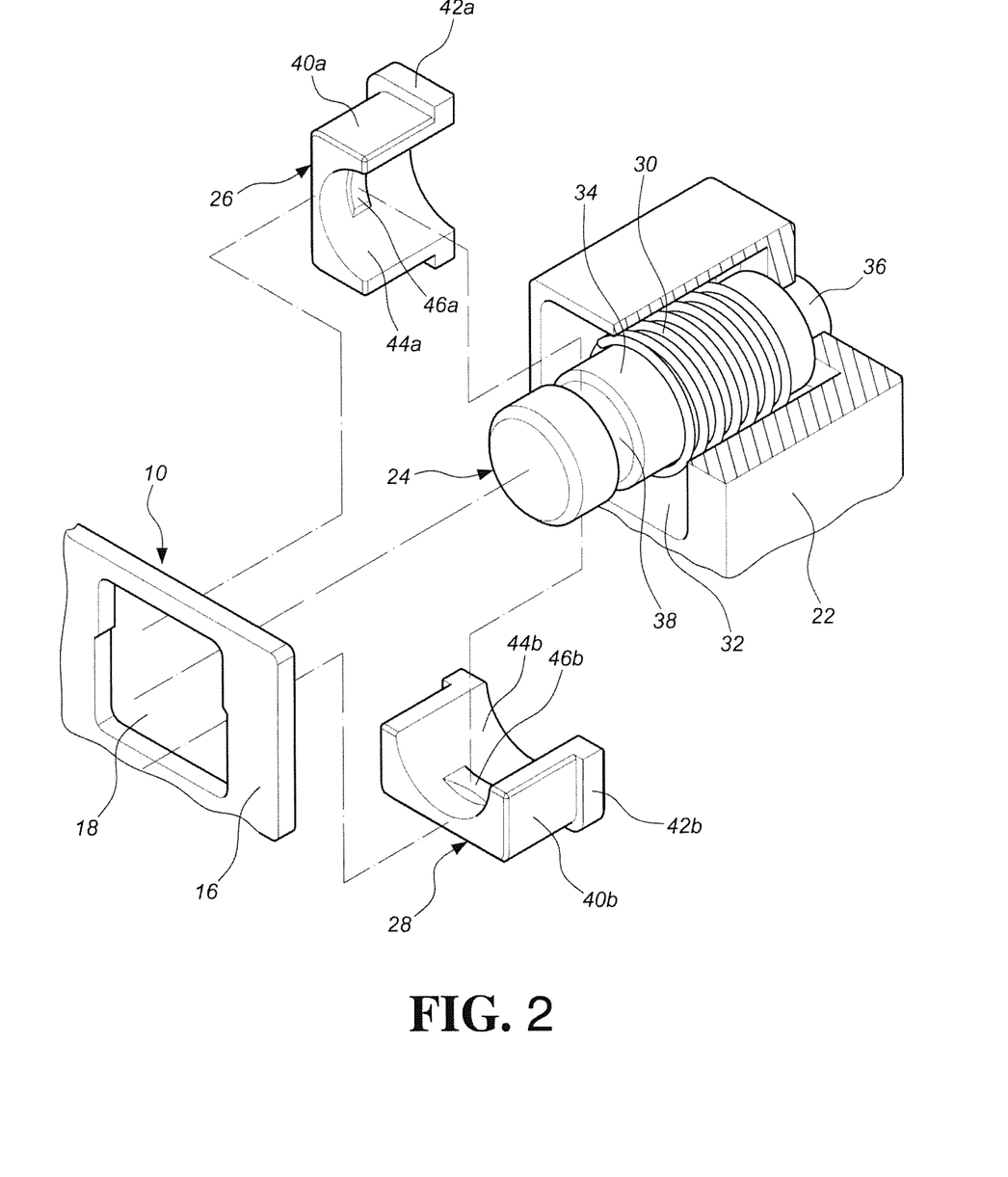
FIG. 2 is a partial exploded view to show the bracket pin assembly of FIG. 1.
Figure 3:
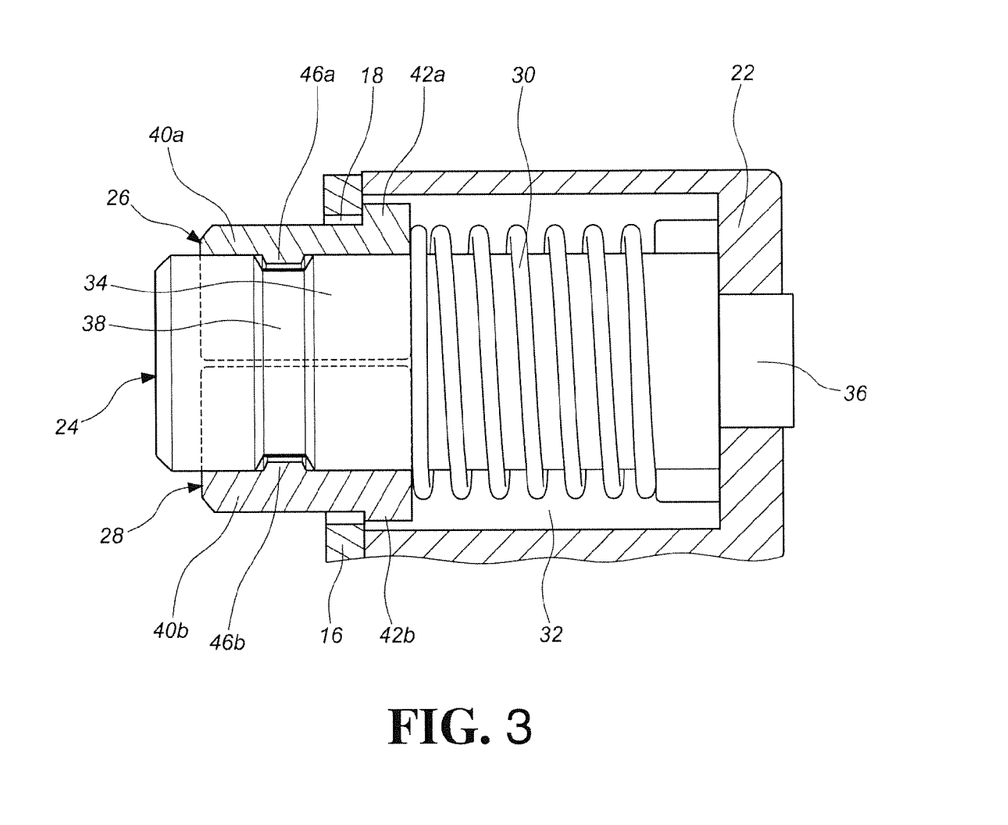
FIG. 3 is a cross sectional view to show the combined configuration of the bracket pin assembly of FIG. 2.

As shown in FIGS. 2 and 3, the base 22 has a chamber 32.

The support member 24 is securely connected to the base 22 and comprises a support section 34, a contact section 36 and an engaging section 38. The contact section 36 extends from the support section 34. The contact section 36 of the support section 34 fixed to the rear sidewall of the chamber 32 of the base 22, and the support section 34 extends through the chamber 32 of the base 22 and the opening 18 of the end plate 16. The engaging section 38 is located in a part of the support section 34. Preferably, the support member 24 is a cylindrical member, and the engaging portion 38 is an annular groove around the outer periphery of the support section 34.

The first installation member 26 is movably connected to the chamber 32 of the base 22 and located above the support member 24. The first installation member 26 comprises a first support portion 40a, a first contact portion 42a, a first recess 44a and a first engaging portion 46a. The first contact portion 42a extends from one end of the first support portion 40a and contacts the wall around the opening 18 of the end plate 16. The first support portion 40a extending through the chamber 32 and the opening 18 of the end plate 16 as shown in FIG. 3. The first recess 44a is located beside the first support portion 40a. The first engaging portion 46a is located in the first recess 44a and adapted to be contact with the engaging section 38. Preferably, the first support portion 40a has a rectangular-like cross section. The first recess 44a is a semi-circular recess so as to receive the cylindrical support member 24. The first engaging portion 46a extends from the first recess 44a.

The second installation member 28 is movably connected to the chamber 32 of the base 22 and located below the support member 24. The second installation member 28 comprises a second support portion 40b, a second contact portion 42b, a second recess 44b and a second engaging portion 46b. The second contact portion 42b extending from one end of the second support portion 40b. The second contact portion 42b contacts the wall around the opening 18 of the end plate 16. The second support portion 40b extends through the chamber 32 of the base 22 and the opening 18 of the end plate 16 as shown in FIG. 3. The second recess 44b is located beside the second support portion 40b. The second engaging portion 46b is located in the second recess 44b and adapted to be contact with the engaging section 38. Preferably, the second installation member 28 and the first installation member 26 form a rectangular combination. The second recess 44b is a semi-circular recess so as to receive the cylindrical support member 24. The second engaging portion 46b extends from the second recess 44b.

The resilient member 30 is located in the chamber 32 of the base 22 so as to bias and maintain the first and second installation members 26, 28 in extended status. Wherein, the first and second installation members 26, 28 can be extended repeatedly after being retracted.

Figure 4:
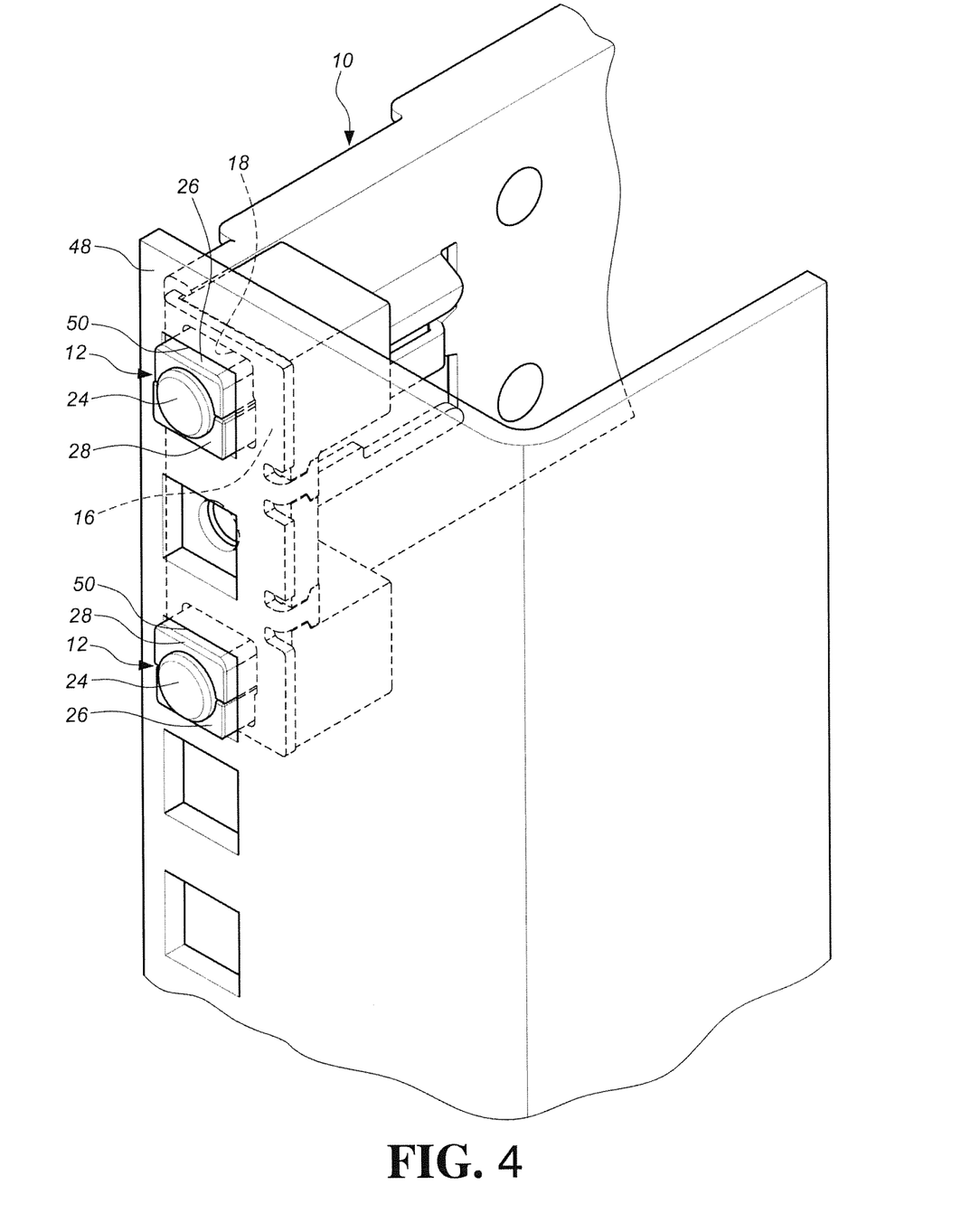
FIG. 4 is a perspective view to show that the bracket pin assembly of FIG. 1 is connected to the first post.
Figure 5:
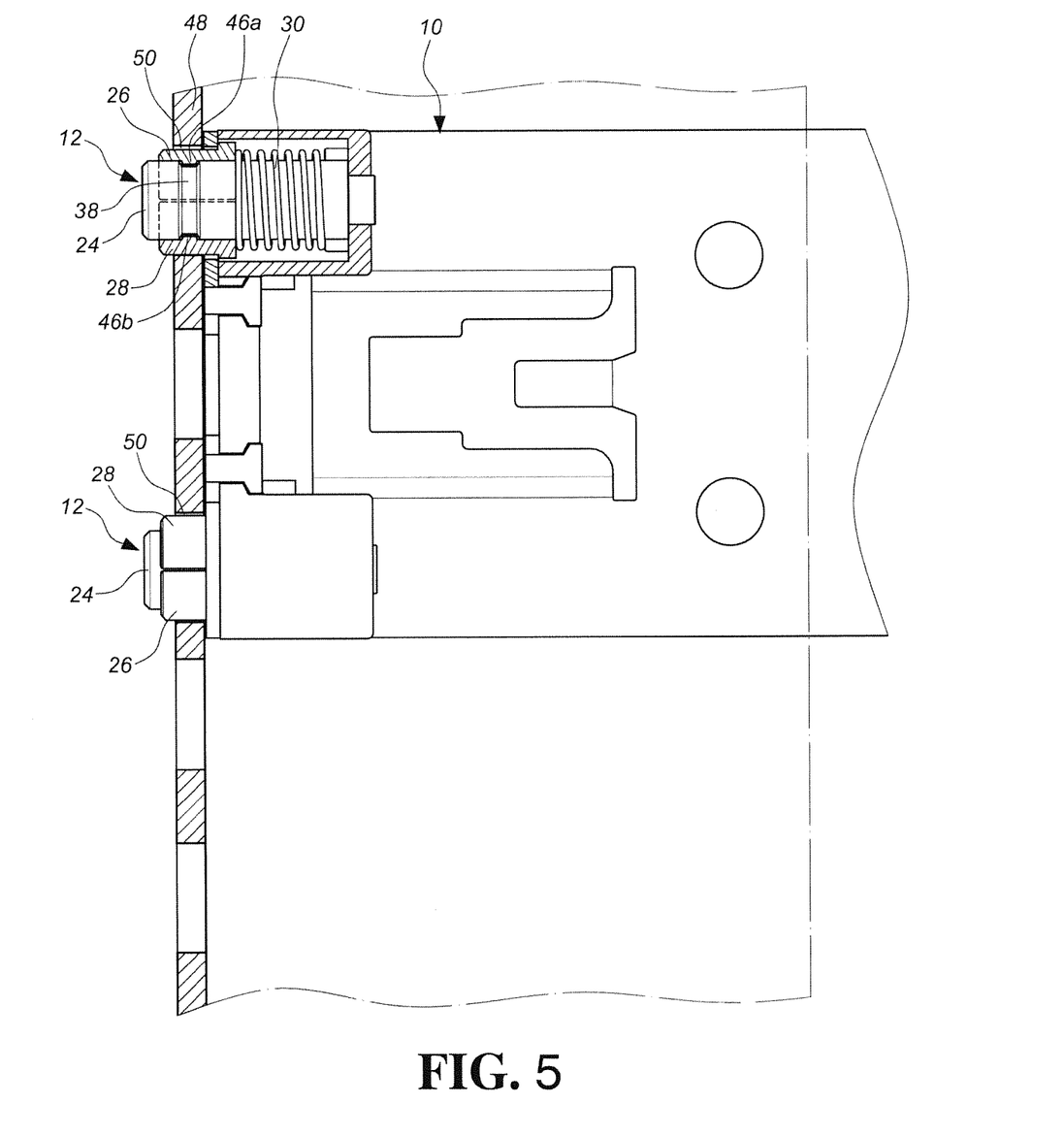
FIG. 5 is a cross sectional view to show that the bracket pin assembly of FIG. 4.

FIGS. 4 and 5 show a preferred embodiment of the present invention, wherein the pins 12 are connected to the openings 18 and located at the upper and lower portions of the end plate 16 of the support plate 10. The pins 12 are also connected to the first installation holes 50 of the first post 48 so as to install the support plate 10 to the first post 48. The multiple first installation holes 50, square holes of the size 9.5 mm×9.5 mm, of the first post 48 are separately aligned in vertical direction. The support plate 10 usually connected to an end of a slide (not shown). The slide is connected to the first post 48 by the support plate 10.

When the support plate 10 is installed to the first post 48, the support member 24, the first installation member 26 and the second installation member 28 of each of the pins 12 extend through the first installation hole 50 of the first post 48 in the longitudinal direction. In this configuration, the first installation member 26 and the second installation member 28 are fitted, such as loose fitted or close fitted, to the first installation hole 50 of the first post 48 in vertical direction. Simultaneously, the first engaging portion 46a of the first installation member 26 and the second engaging portion 46b of the second installation member 28 are engaged with the engaging section 38 of the support member 24 so that the first and second installation members 26, 28 cannot move in the longitudinal direction relative to the support member 24. In other words, when the support plate 10 is installed to the first post 48, the first and second installation members 26, 28 extend through the first installation hole 50 of the first post 48. In this circumstance, the first and second installation members 26, 28 cannot be retracted from the first installation hole 50 and thus confirm the positioned status of the bracket pin assembly.

Figure 6:
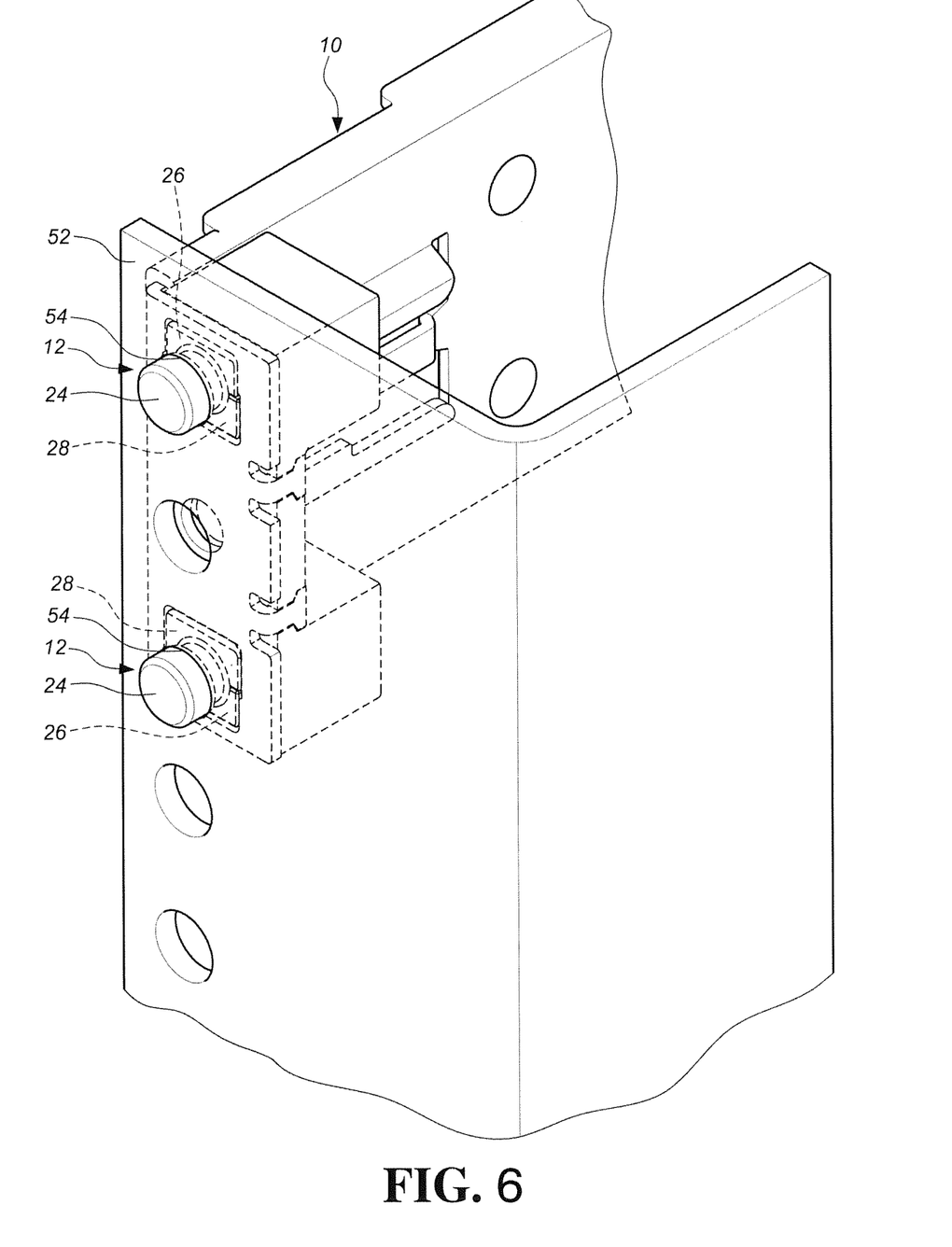
FIG. 6 is a perspective view to show that the bracket pin assembly of FIG. 1 is connected to the second post.
Figure 7:
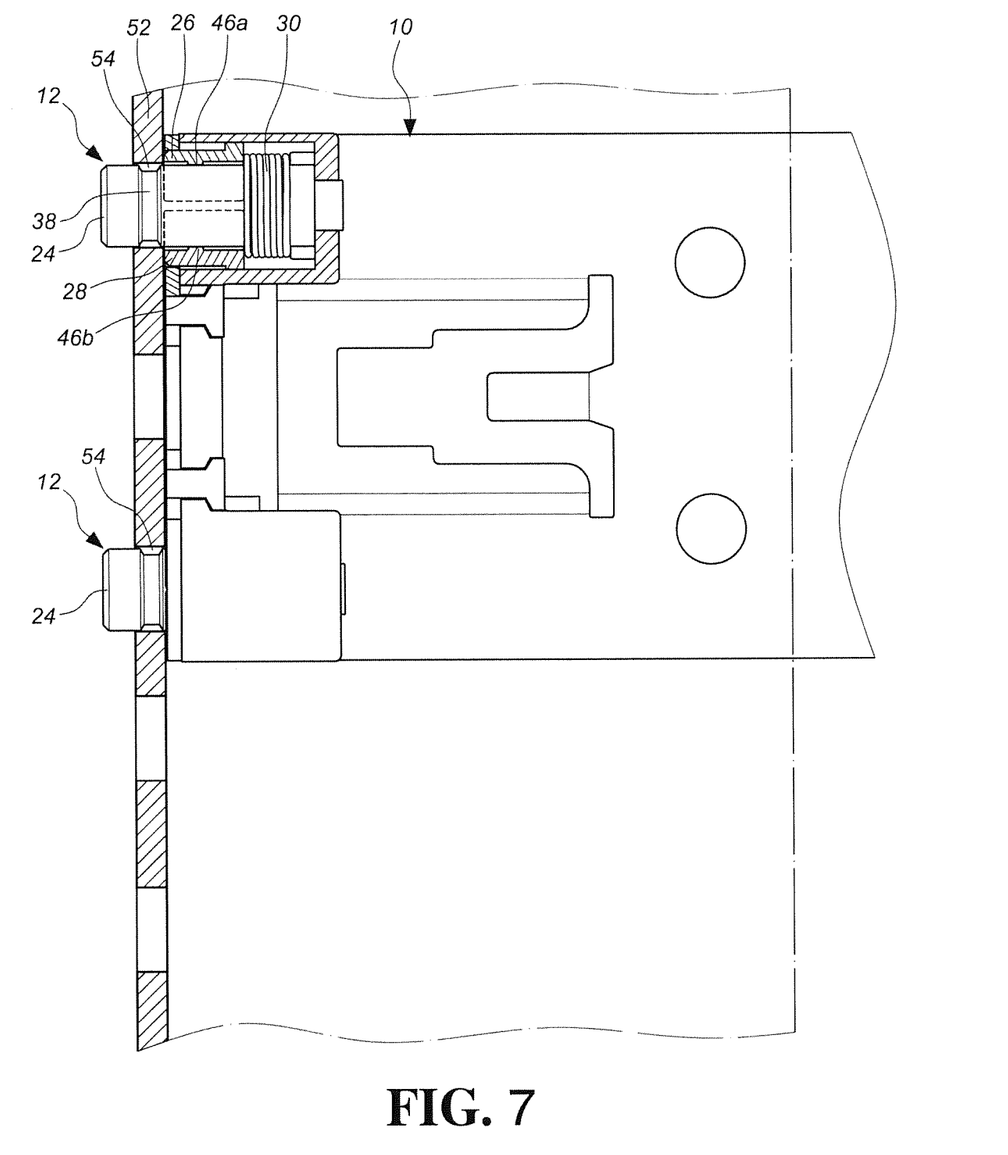
FIG. 7 is a cross sectional view to show that the bracket pin assembly of FIG. 6.

FIGS. 6 and 7 show the preferred embodiment of the present invention that the pin 12 of the present invention is connected to the second post 52 which has multiple second installation holes 54 separately aligned in vertical direction. Each of the installation holes 54 of the second post 52 is circular hole with a diameter of 7.0 mm. More specifically, when the support plate 10 is installed to the second post 52, the support members 24 of the pins 12 extend through the second installation holes 54 of the second post 52, and the first and second installation members 26, 28 of the pins 12 are pushed by the second post 52. The first engaging portion 46a of the first installation member 26 and the second engaging portion 46b of the second installation member 28 are disengaged from the engaging section 38 of the support member 24. The first and second installation members 26, 28 are retracted into the chamber 32 of the base 22, and the resilient member 30 in the chamber 32 is compressed. The support members 24 of the pins 12 is installed to the second installation hole 54 of the second post 54 in the longitudinal direction.

Figure 8:
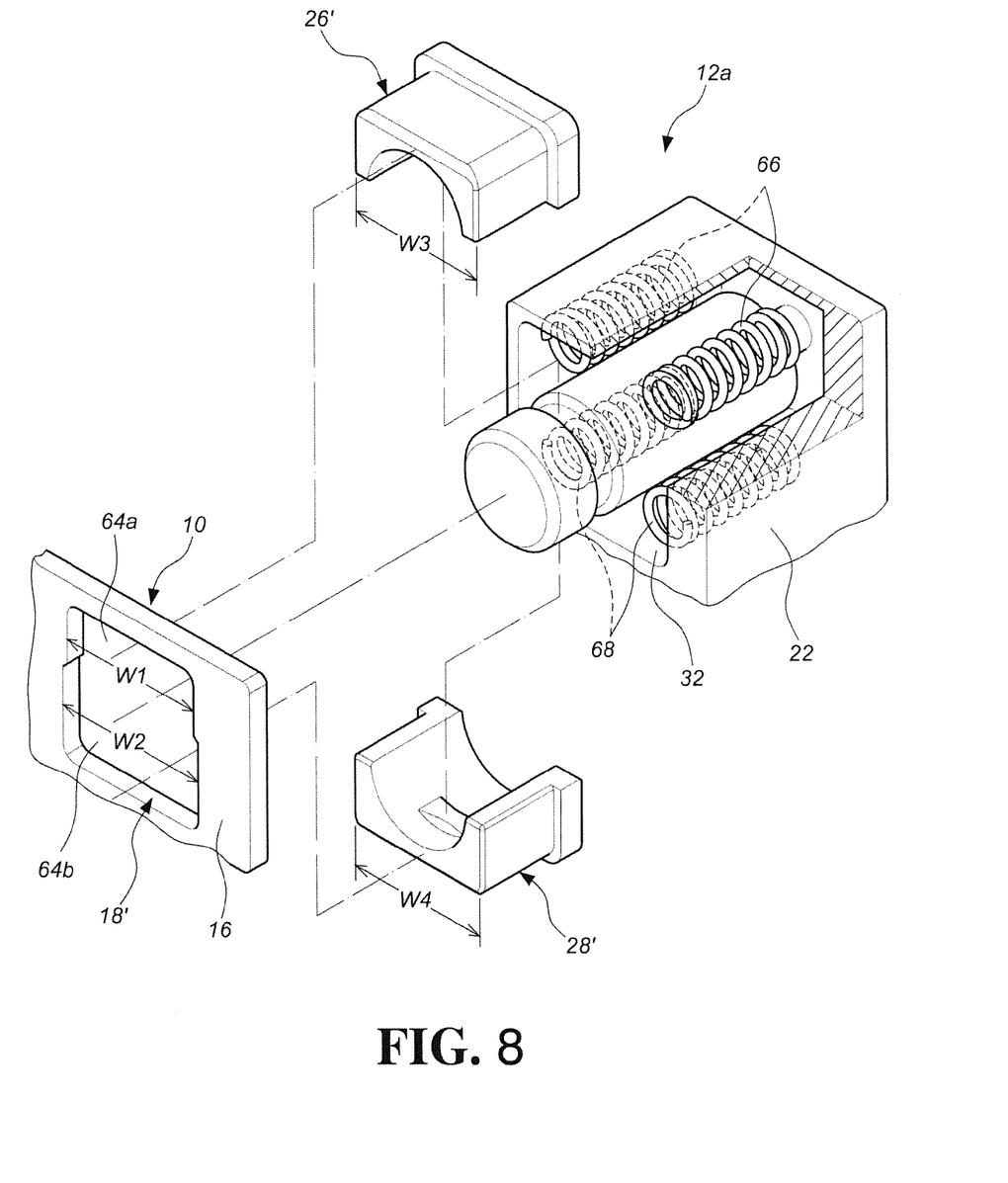
FIG. 8 is a partial exploded view to show the second embodiment of the bracket pin assembly of the present invention.
Figure 9:
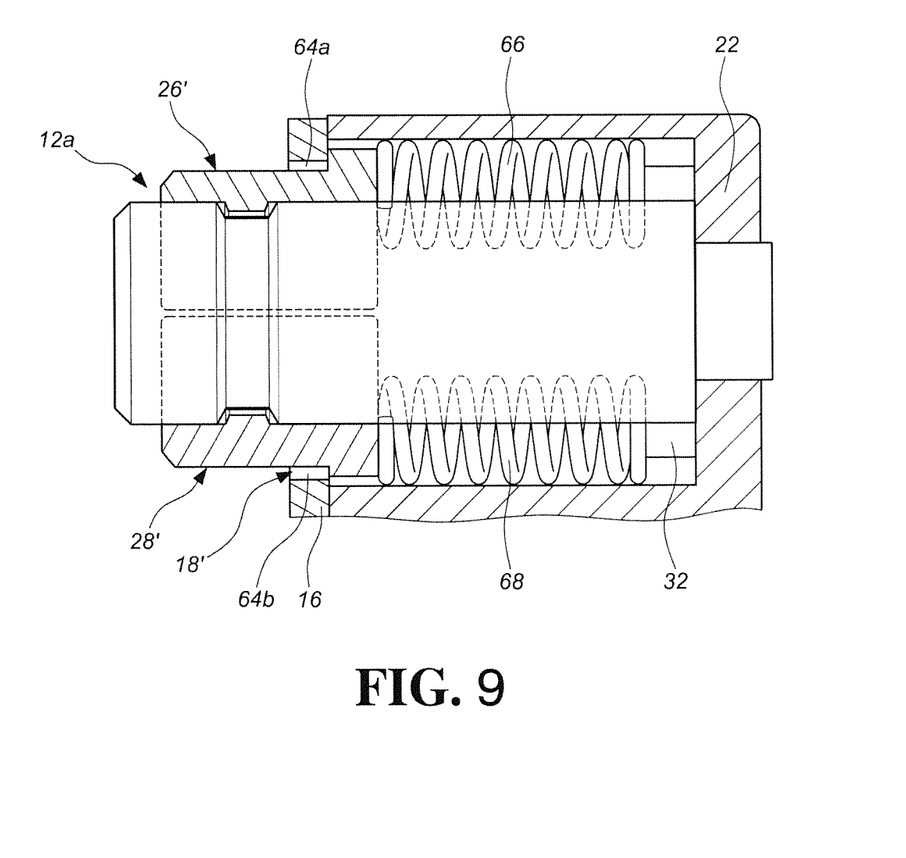
FIG. 9 is a cross sectional view to show bracket pin assembly of FIG. 8.

FIGS. 8-11 show the second embodiment of the present invention. In FIGS. 8 and 9, the opening 18' of the end plate 16 comprises a first window 64a and a second window 64b. The width W2 of the second window 64b is slightly larger than the width W1 of the first window 64a. The width W4 of a second installation member 28' is slightly larger than the width W3 of a first installation member 26'. Accordingly, the first installation member 26' is only engaged with the first window 64a, and the second installation member 28' is only engaged with the second window 64b. Multiple resilient members, such as first and second resilient members 66, 68 are located in the chamber 32 of the base 22. The first resilient member 66 biases the first installation member 26', and the second resilient member 68 biases the second installation member 28', such that the first and second installation members 26', 28' can be moved and returned individually.

Figure 10:
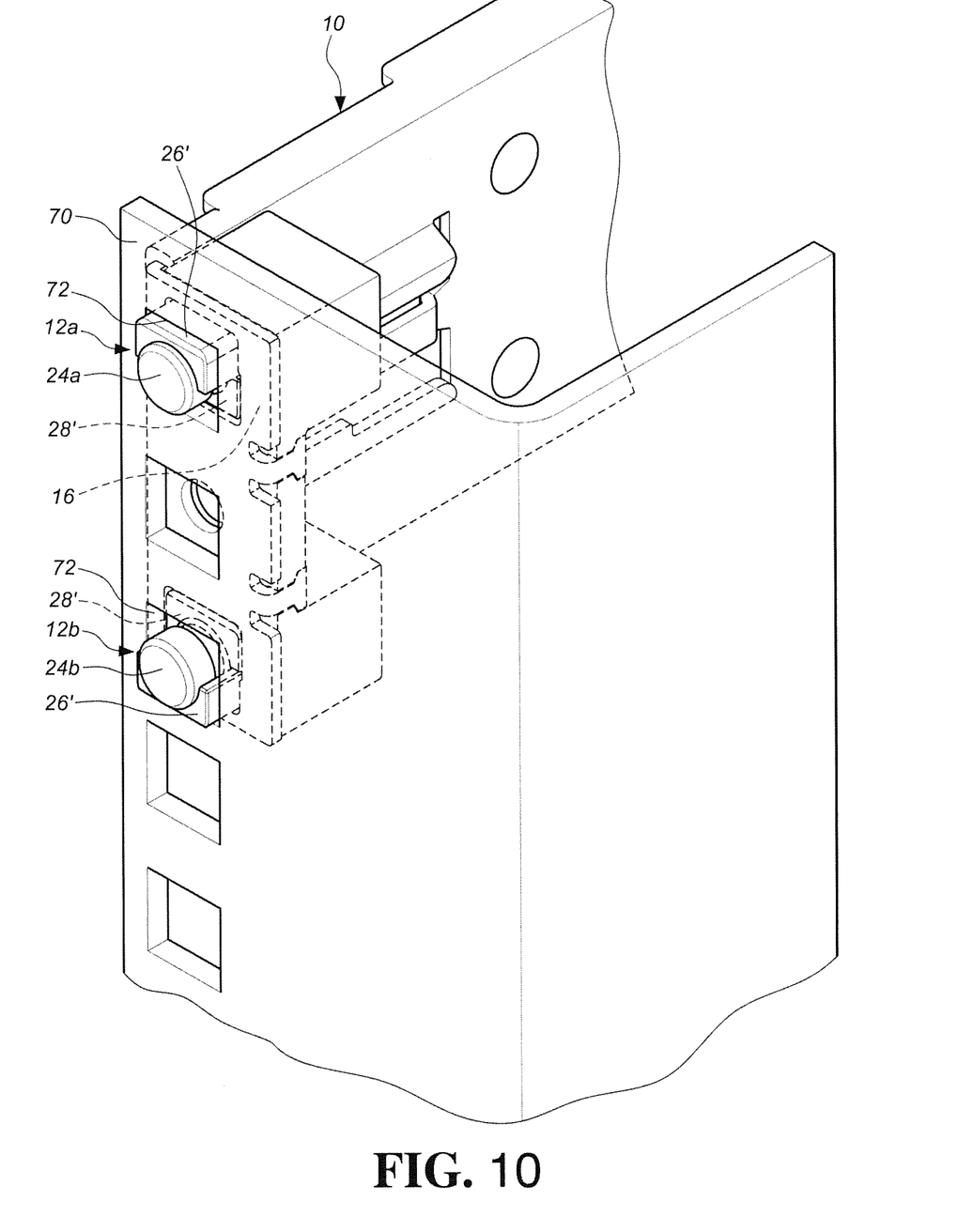
FIG. 10 is a perspective view to show the bracket pin assembly of the FIG. 8 is connected to the third post.
Figure 11:
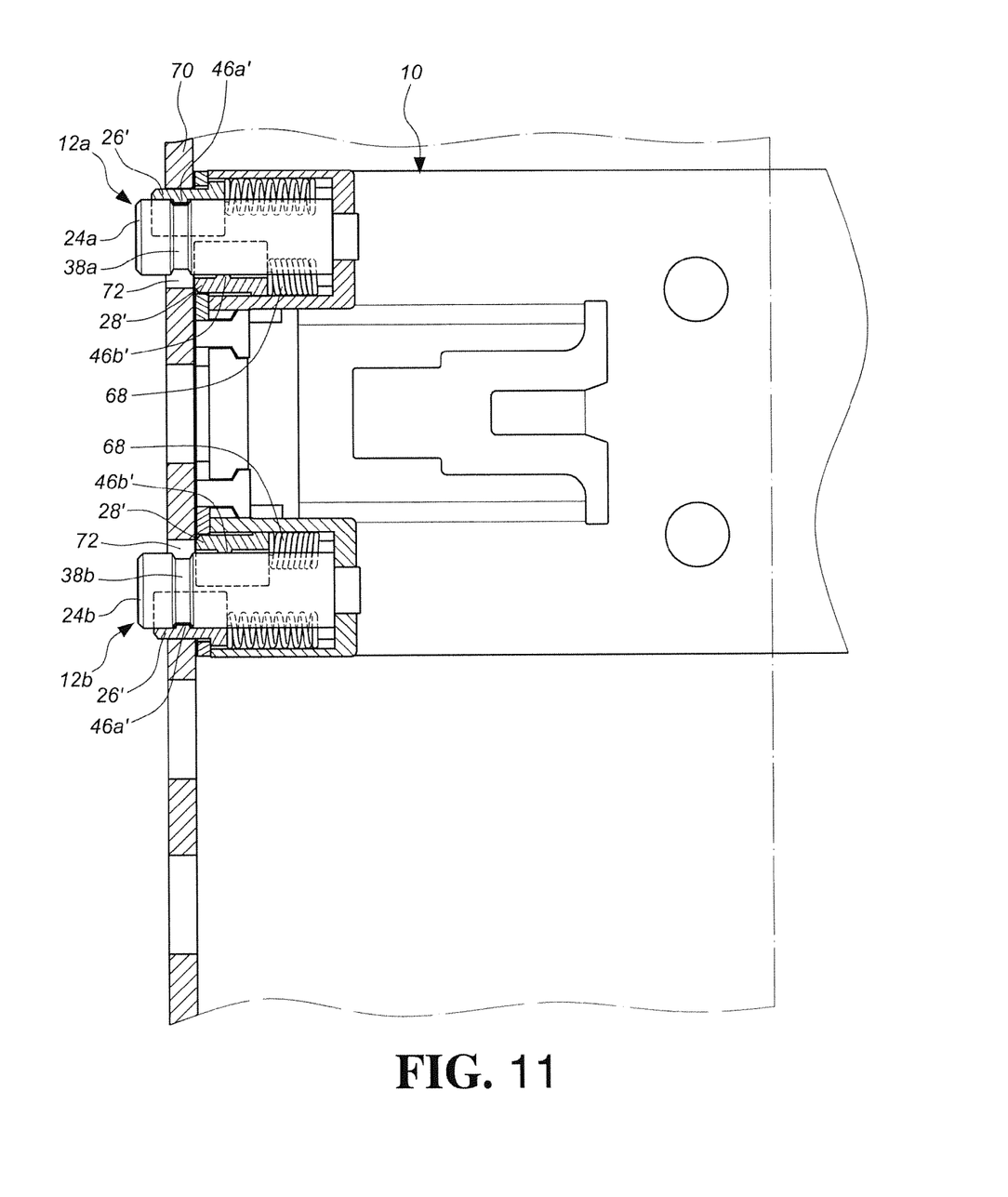
FIG. 11 is a cross sectional view to show the bracket pin assembly of FIG. 10.

In FIGS. 10 and 11, the pins 12a, 12b of the present invention is connected to a third post 70. Wherein, the pins 12a and 12b are connected to the upper and lower portions of the end plate 16 of the support plate 10. The pins 12a and 12b are also connected to the third post 70 so that the support plate 10 is installed to the third post 70 (see FIG. 10). The second installation member 28' of the upper pin 12a is located below the support member 24a, and the second installation member 28' of the lower pin 12b is located above the support member 24b. The third post 70 has multiple third installation holes 72 which are separately aligned in vertical direction. Each of the third installation holes 72 is square hole with the size of 9 mm×9 mm.

More specifically, when the support plate 10 is installed to the third post 70 by the installing the pins 12a, 12b to the third installation holes 72 of the third post 70. Wherein, the support members 24a, 24b of the pins 12a, 12b and the first installation members 26' extend through the third installation holes 72 of the third post 70 in longitudinal direction. The second installation members 28' of the pins 12a, 12b contact the wall around the third installation holes 72 of the third post 70. The second engaging portions 46b' of the second installation members 28' are disengaged from the engaging sections 38a, 38b of the support members 24a, 24b, such that the second installation members 28' retract inward the chambers 32 and compress the second resilient members 68. When the support members 24a, 24b of the pins 12a, 12b and the first installation members 26' are completely connected to the third installation holes 72 of the third post 70, the first installation members 26' and the support members 24a, 24b of the pins 12a, 12b cannot move in vertical direction relative to the third installation holes 72 of the third post 70 by the restriction of the third installation holes 72 of the third post 70. The first engaging portions 46a' of the first installation members 26' of the pins 12a, 12b contact the engaging sections 38a, 38b of the support members 24a, 24b, such that the first installation members 26' of the pins 12a, 12b cannot separate from the third installation holes 72 in longitudinal direction relative to the support members 24a, 24b. Therefore, the support plate 10 is firmly connected to the third post 70.

The pins of the present invention can be connected to the first installation holes 50 of the first post 48, the second installation holes 54 of the second post 52 and the third installation holes 72 of the third post 70.

While we have shown and described the embodiments in accordance with the present invention, it should be clear to those skilled in the art that further embodiments may be made without departing from the scope of the present invention.

What is claimed is:

1. A bracket pin assembly comprising:
a support plate having an end plate which has at least one opening;
a pin connected to the end plate of the support plate and comprising a base, a support member, a first installation member, a second installation member, and at least one resilient member;
the base having a chamber;
the support member connected to the base and having a support section and an engaging section, the support section extending through the chamber of the base and the at least one opening of the end plate, the engaging section located in a part of the support section;
the first installation member movably connected to the chamber of the base and comprising a first support portion, a first contact portion, a first recess and a first engaging portion, the first contact portion extending from the first support portion and contacting a wall around the at least one opening of the end plate, the first support portion extending through the chamber and the at least one opening of the end plate, the first recess located beside the first support portion, the first engaging portion located in the first recess and adapted to be contact with the engaging section;
the second installation member movably connected to the chamber of the base and comprising a second support portion, a second contact portion, a second recess and a second engaging portion, the second contact portion extending from the second support portion and contacting the wall around the at least one opening of the end plate, the second support portion extending through the chamber and the at least one opening of the end plate, the second recess located beside the second support portion, the second engaging portion located in the second recess and adapted to be contact with the engaging section, and
the at least one resilient member located in the chamber of the base and biasing the first and second installation members;
wherein the first and second installation members form a rectangular combination, the support member is a cylindrical member, and the first recess of the first installation member and the second recess of the second installation member are respectively configured as semi-circular recesses corresponding to the cylindrical support member.

2. The bracket pin assembly as claimed in claim 1, wherein the engaging section of the support member is an annular recess around the part of the support section, the first engaging portion of the first installation member extends from the first recess, and the second engaging portion of the second installation member extends from the second recess.

3. The bracket pin assembly as claimed in claim 1, wherein the at least one opening of the end plate has first and second windows, having different sizes from each other, the first window is adapted for insertion of the first installation member, the second window is adapted for insertion of the second installation member, and at least two resilient members respectively bias the first and second installation members.

4. The bracket pin assembly as claimed in claim 1, wherein the end plate comprises two openings which are separately aligned in vertical direction, and two pins, corresponding to the two openings, are assembled to upper and lower portions of the end plate.

5. The bracket pin assembly as claimed in claim 4, wherein the two pins are assembled with the two openings in the upper and lower portions of the end plate of the support plate.

6. A bracket pin assembly comprising:
a support plate having an end plate which has at least one opening;
a pin connected to the end plate of the support plate and comprising a base, a support member, a first installation member, a second installation member, and at least one resilient member;
the base having a chamber;
the support member connected to the base and having a support section and an engaging section, the support section extending through the chamber of the base and the at least one opening of the end plate, the engaging section located in a part of the support section;
the first installation member movably connected to the chamber of the base and comprising a first support portion, a first contact portion, a first recess and a first engaging portion, the first contact portion extending from the first support portion and contacting a wall around the at least one opening of the end plate, the first support portion extending through the chamber and the at least one opening of the end plate, the first recess located beside the first support portion, the first engaging portion located in the first recess and adapted to be contact with the engaging section;
the second installation member movably connected to the chamber of the base and comprising a second support portion, a second contact portion, a second recess and a second engaging portion, the second contact portion extending from the second support portion and contacting the wall around the at least one opening of the end plate, the second support portion extending through the chamber and the at least one opening of the end plate, the second recess located beside the second support portion, the second engaging portion located in the second recess and adapted to be contact with the engaging section, and the at least one resilient member located in the chamber of the base and biasing the first and second installation members;

wherein the engaging section of the support member is an annular recess around the part of the support section, the first engaging portion of the first installation member extends from the first recess, and the second engaging portion of the second installation member extends from the second recess.

7. The bracket pin assembly as claimed in claim 6, wherein the at least one opening of the end plate has first and second windows, having different sizes from each other, the first window is adapted for insertion of the first installation member, the second window is adapted for insertion of the second installation member, and at least two resilient members respectively bias the first and second installation members.

8. The bracket pin assembly as claimed in claim 6, wherein the end plate comprises two openings which are separately aligned in vertical direction, and two pins, corresponding to the two openings, are assembled to upper and lower portions of the end plate.

9. The bracket pin assembly as claimed in claim 6, wherein the two pins are assembled with the two openings in the upper and lower portions of the end plate of the support plate.

10. A bracket pin assembly comprising:
a support plate having an end plate which has at least one opening;
a pin connected to the end plate of the support plate and comprising a base, a support member, a first installation member, a second installation member, and at least one resilient member;
the base having a chamber;
the support member connected to the base and having a support section and an engaging section, the support section extending through the chamber of the base and the at least one opening of the end plate, the engaging section located in a part of the support section;

the first installation member movably connected to the chamber of the base and comprising a first support portion, a first contact portion, a first recess and a first engaging portion, the first contact portion extending from the first support portion and contacting a wall around the at least one opening of the end plate, the first support portion extending through the chamber and the at least one opening of the end plate, the first recess located beside the first support portion, the first engaging portion located in the first recess and adapted to be contact with the engaging section;

the second installation member movably connected to the chamber of the base and comprising a second support portion, a second contact portion, a second recess and a second engaging portion, the second contact portion extending from the second support portion and contacting the wall around the at least one opening of the end plate, the second support portion extending through the chamber and the at least one opening of the end plate, the second recess located beside the second support portion, the second engaging portion located in the second recess and adapted to be contact with the engaging section, and the at least one resilient member located in the chamber of the base and biasing the first and second installation members;

wherein the at least one opening of the end plate has first and second windows, having different sizes from each other, the first window is adapted for insertion of the first installation member, the second window is adapted for insertion of the second installation member, and at least two resilient members respectively bias the first and second installation members.

11. The bracket pin assembly as claimed in claim 10, wherein the end plate comprises two openings which are separately aligned in vertical direction, and two pins, corresponding to the two openings, are assembled to upper and lower portions of the end plate.

12. The bracket pin assembly as claimed in claim 10, wherein the two pins are assembled with the two openings in the upper and lower portions of the end plate of the support plate.

* * * * *